United States Patent
Trager et al.

(10) Patent No.: US 8,739,006 B2
(45) Date of Patent: May 27, 2014

(54) REDUCED CIRCUIT IMPLEMENTATION OF ENCODER AND SYNDROME GENERATOR

(75) Inventors: Barry M. Trager, Yorktown Heights, NY (US); Shmuel Winograd, Scarsdale, NY (US)

(73) Assignee: International Business Machines Corporation, Armonk, NY (US)

( * ) Notice: Subject to any disclaimer, the term of this patent is extended or adjusted under 35 U.S.C. 154(b) by 391 days.

(21) Appl. No.: 13/168,559

(22) Filed: Jun. 24, 2011

(65) Prior Publication Data

US 2012/0005561 A1 Jan. 5, 2012

Related U.S. Application Data

(60) Provisional application No. 61/360,265, filed on Jun. 30, 2010.

(51) Int. Cl.
*H03M 13/00* (2006.01)
*H03M 13/03* (2006.01)
*G06F 11/00* (2006.01)

(52) U.S. Cl.
USPC ............ 714/785; 714/758; 714/793; 714/802

(58) Field of Classification Search
USPC ......... 714/785, 758, 761–762, 754, 787–788, 714/793, 799, 802, 752, 746, 6.24, 48, 52
See application file for complete search history.

(56) References Cited

U.S. PATENT DOCUMENTS

| | | | | |
|---|---|---|---|---|
| 4,667,326 A | * | 5/1987 | Young et al. | 714/762 |
| 5,444,719 A | | 8/1995 | Cox et al. | |
| 6,275,965 B1 | | 8/2001 | Cox et al. | |
| 6,438,726 B1 | * | 8/2002 | Walters, Jr. | 714/764 |
| 6,487,691 B1 | | 11/2002 | Katayama et al. | |
| 2004/0019842 A1 | * | 1/2004 | Argon et al. | 714/755 |
| 2012/0072810 A1 | * | 3/2012 | Yim et al. | 714/785 |

OTHER PUBLICATIONS

Fettweis, G., "A Combined Reed-Solomon Encoder and Syndrome Generator with Small Hardware Complexity", Circuits and Systems, ISCAS '92 Proceedings, IEEE International Symposium, pp. 1871-1874 vol. 4, May 1992.

* cited by examiner

*Primary Examiner* — Christine Tu
(74) *Attorney, Agent, or Firm* — Scully, Scott, Murphy & Presser, P.C.; Daniel P. Morris, Esq.

(57) ABSTRACT

An error correction method and system includes an Encoder and Syndrome-generator that operate in parallel to reduce the amount of circuitry used to compute check symbols and syndromes for error correcting codes. The system and method computes the contributions to the syndromes and check symbols 1 bit at a time instead of 1 symbol at a time. As a result, the even syndromes can be computed as powers of the odd syndromes. Further, the system assigns symbol addresses so that there are, for an example $GF(2^8)$ which has 72 symbols, three (3) blocks of addresses which differ by a cube root of unity to allow the data symbols to be combined for reducing size and complexity of odd syndrome circuits. Further, the implementation circuit for generating check symbols is derived from syndrome circuit using the inverse of the part of the syndrome matrix for check locations.

23 Claims, 7 Drawing Sheets

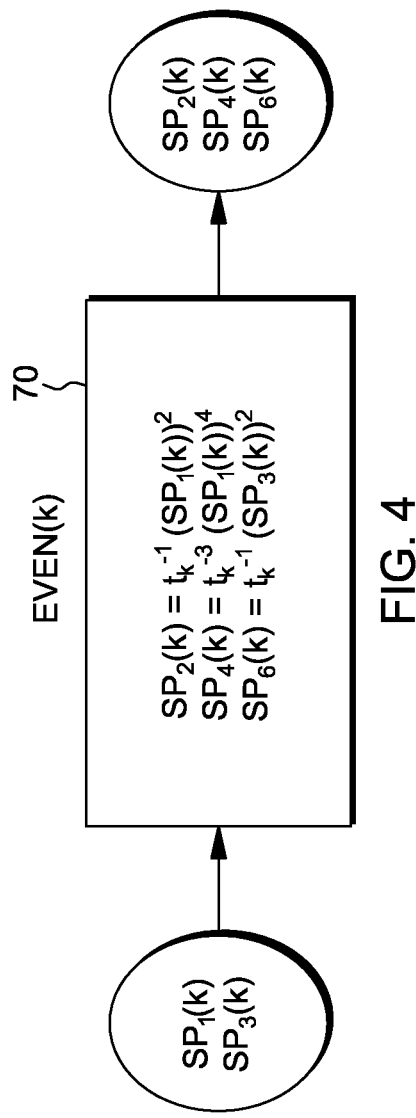
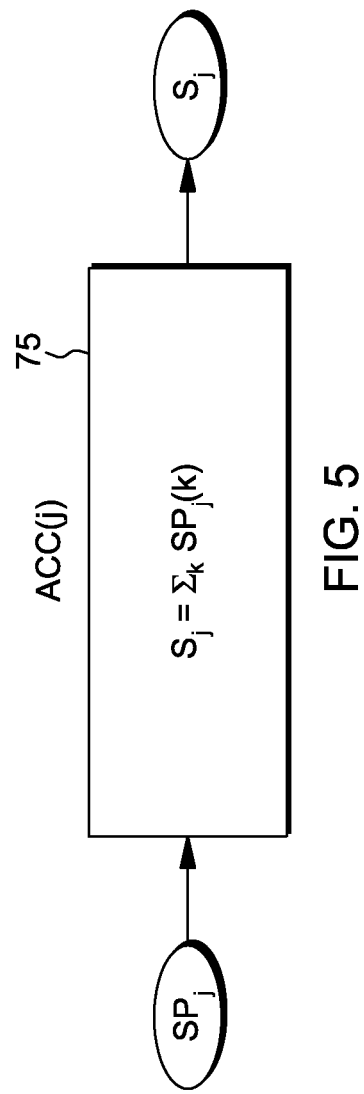

ically, in the encode system 10 shown in FIG. 1A, during a write operation, the raw data 12, usually a cache line, is input to an encoder device 15 which computes and adds check symbols 20 to the data and stores a code-word 25 (data including the check symbols) in a memory storage device.
REDUCED CIRCUIT IMPLEMENTATION OF ENCODER AND SYNDROME GENERATOR

CROSS REFERENCE TO RELATED APPLICATIONS

This application claims the benefit of U.S. Provisional Application No. 61/360,265, filed on Jun. 30, 2010, the entire contents and disclosure of which is incorporated herein by reference as if fully set forth herein.

STATEMENT OF GOVERNMENT INTEREST

This invention was made with Government support under subcontract number B554331 awarded by the Department of Energy. The Government has certain rights in this invention.

BACKGROUND

The present invention relates generally to error correcting codes implemented in computer memory systems.

During the process of storing data in computer memory and then retrieving it, the data may be corrupted; therefore an error-correcting-code is used to encode the data before it is stored, and decode it after it was retrieved. Very often a Reed-Solomon (RS) code is used. The overall RS encode and decode process is shown in respective FIGS. 1A and 1B which, in sum, depicts an error correction system, implementing, for example, a Reed Solomon encoding scheme. Generally, in the encode system 10 shown in FIG. 1A, during a write operation, the raw data 12, usually a cache line, is input to an encoder device 15 which computes and adds check symbols 20 to the data and stores a code-word 25 (data including the check symbols) in a memory storage device.

In some instances, during transmission to a memory storage device, the encoded word may become corrupted and contain errors. In the decode system 30 shown in FIG. 1B, the code-word 25' which may contain errors is read from memory during a read operation, and the code-word is sent to an (error correcting circuit) ECC, e.g., including an RS-Decoder 50 and a syndrome generator which corrects any errors which had occurred, and stores the encoded data 55 is forwarded to the cache, for example.

The first stage of the Decoder of a Reed-Solomon code is the Syndrome-generator 40 for calculating syndromes that will be key in detecting where the errors are and correcting the errors. In some serial implementations, syndrome calculation may take one clock cycle for each syndrome calculation, which speed may suffice for hard disk drives, but would exhibit undue amount of latency for error correcting codes used for computer memory (RAM, SRAM, etc.).

Since latency is critical, the usual parallel implementation of both the Syndrome-generator and the Encoder requires a large amount of circuitry when Reed-Solomon codes are used to protect the data in memory, such as computer memory since both of these modules have a large number of inputs: the Syndrome-generator 40, for example, receives and uses all the data read from memory to generate the syndromes, and the Encoder 15 receives and uses all the data to be stored in memory to generate the check symbols.

Ideally, the entire RS decoder circuitry for computer circuitry needs to complete in a very small number of cycles, and it would be highly desirable to provide a circuit implementation that encodes all the data or computes syndromes in parallel in a minimum of clock cycles, e.g., one or 2 clock cycles.

It would be highly desirable to provide a parallel-implemented ECC system of reduced circuit size and method for computing check symbols and syndromes for error correcting codes in a computer memory system.

SUMMARY

A novel system and implementation of an Encoder and Syndrome-generator which reduces the amount of circuitry used.

The novel system and implementation of an Encoder and Syndrome-generator operates in parallel to reduce the amount of circuitry used to compute check symbols and syndromes for error correcting codes in as few clock cycles as possible, e.g., 1 or 2 clock cycles.

Further, in one embodiment, the system and method employed computes the contributions to the syndromes and check symbols 1 bit at a time instead of 1 symbol at a time. As a result, the even syndromes can be computed as powers of the odd syndromes.

Further, the implementation circuit for generating check symbols is derived from the syndrome circuit using an inverse of the part of the syndrome generator matrix for check locations. These implementations yield a syndrome generator/encoder circuit which is less than half the size of a conventional parallel circuit implementation that performs the same task.

In one aspect there is provided, an error correction code (ECC) syndrome generator circuit comprising: first syndrome generator circuitry for receiving data symbols and generating partial odd syndrome values, $SPj(k)$'s, j odd, for each bit location k of the output data symbol, wherein k=0, 1, 2, . . . K−1 bits; second syndrome generator circuitry for receiving the partial odd syndromes [$SPj(k)$'s, j odd] and computes partial even syndromes values for each bit location k; and, first accumulator circuitry for receiving the partial odd syndromes and partial even syndromes, $SPj(k)$, and compute the syndromes $Sj=\Sigma_k SPj(k)$, j is number of syndromes to be generated and k is number of bits of in a data symbol.

Further to this aspect, the first syndrome generator circuitry and said second syndrome generator circuit computes contributions to respective partial odd and even syndromes one data bit at a time.

Further to this aspect, a data encoder circuit is implemented for computing check symbols, said data encoder circuit comprising said syndrome generator circuitry, wherein said syndromes generated for data symbols are generated at said syndrome generator circuitry using a first matrix, said data encoder comprising: means for multiplying said generated syndromes to an inverse of said first matrix for determining check symbol values corresponding to said data to be encoded.

In one aspect, the error correction code (ECC) syndrome generator circuit comprises: third syndrome generator circuitry receiving the data symbols and generating respective odd partial check symbols; a fourth syndrome generator circuitry circuit receiving the respective partial check symbols and computing a check symbol vector comprising individual bit values of the check symbol; and, second accumulator circuitry for receiving the check symbol vector comprising individual bit values and accumulating the partial syndromes to result in a check symbol $cj=\Sigma_k cj(k)$ where j is number of check symbols to be generated and k is number of bits of in a data symbol.

The ECC syndrome generator circuit the syndromes and the check symbols are computed for a Reed-Solomon code over $GF(2^8)$ with 7 or 8 syndromes and respective 7 or 8 check symbols.

In a further aspect, there is provided a method for computing the syndromes of an Error Correcting Code (ECC) comprising: receiving data symbols at first syndrome generator circuitry and generating partial odd syndrome values, the first syndrome generator circuitry computing partial odd syndrome results [SPj(k)'s] for odd values of j, wherein k=0, 1, 2, ..., K−1 represents the number of bits in a symbol; receiving, at second syndrome generator circuitry, the partial odd syndromes SPj(k)'s, j odd, and computing partial even syndromes from the partial odd syndromes a single bit at a time; and, receiving, at first accumulator circuitry, the partial odd syndromes and partial even syndromes, SPj(k), and compute the syndromes $Sj=\Sigma_k SPj(k)$, j is number of syndromes to be generated and k is number of bits of in a data symbol.

A computer program product is for performing operations. The computer program product includes a storage medium readable by a processing circuit and storing instructions run by the processing circuit for running a method. The method is the same as listed above.

BRIEF DESCRIPTION OF THE FIGURES

The objects, features and advantages of the present invention will become apparent to one skilled in the art, in view of the following detailed description taken in combination with the attached drawings, in which:

FIG. 4 depicts an EVEN(k) circuit 70 that receives as inputs from ODD(k) circuit 65 the partial syndrome outputs $SP_j(k)$'s, j odd, and it computes and partial even syndrome outputs according to an example embodiment;

FIG. 5 depicts an accumulator circuit that receives as inputs the partial even and odd syndromes, $SP_j(k)$, and computes the syndromes according to $S_j=\Sigma_k SP_j(k)$;

DETAILED DESCRIPTION

Figure 1A:
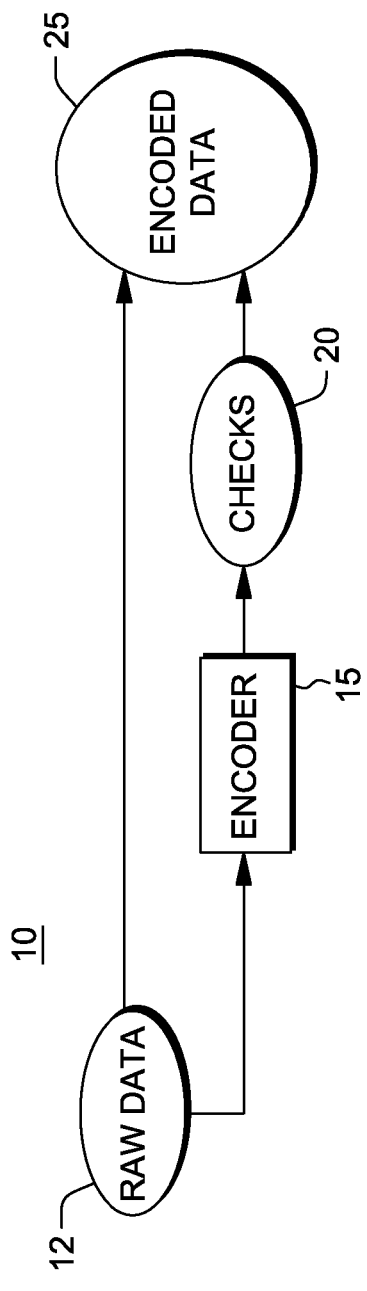
FIG. 1A depicts processing of a write operation where, the raw data is input to an encoder device which computes and adds check symbols to the data and stores a code-word (data including the check symbols) in a memory storage device.
Figure 1B:
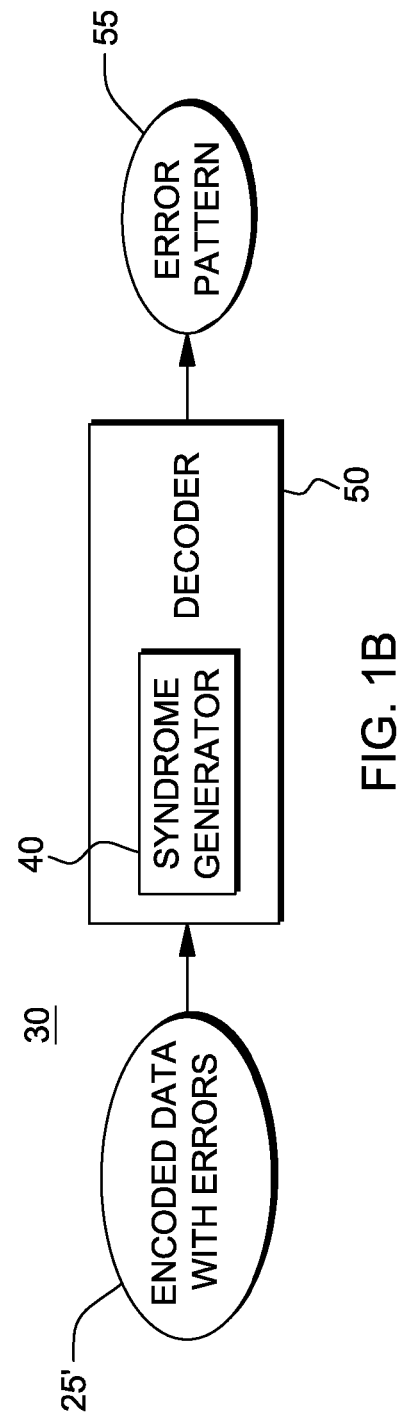
FIG. 1B depicts processing in a decoder circuit including syndrome generator for correcting errors of an encoded word that may become corrupted.

An implementation of the Encoder and Syndrome-generator which reduces the amount of ECC circuitry for single and multiprocessor systems is now described with respect to a specific code such as a Reed-Solomon code.

As described herein, a parallel implementation of a Reed Solomon (RS) encoder/decoder is characterized as constituting a polynomial using the element in the Galois field $GF(2^v)$ where "v" is the symbol size in bits and can be a positive odd or even integer number. As described herein, "n" represents a codeword block length in symbols and may be 72 in one embodiment; and k represent the number of data symbols (data length), e.g., 65, resulting in an RS(72, 65) encoding scheme where the number of RS(n,k) check (block parity) symbols is 7.

For purposes of description herein, and in a non-limiting example, a specific RS code implemented is over a $GF(2^8)$ field having 72 symbols, seven (7) of which are check symbols, and the remaining 65 symbols are data symbols, i.e., an RS(72, 65). The error correction capability for such an encoding scheme is "t", where 2t=n−k, for the example RS(72, 65) described herein, up to 3 symbol errors in each code word may be detectable. That is, the RS encoding scheme could generate syndromes (e.g., 7 check symbols) that correct up to 3 errors in the 65 data bytes (e.g., three (3) symbol errors are detectable).

Another reference embodiment has eight (8) check symbols and 64 data symbols, i.e., an RS(72, 64). Each symbol in the codeword is 8 bits wide. The first "k" symbols in the Reed-Solomon Encoder output are data (information) symbols, e.g., 64, and the last n−k symbols, e.g., check (block parity) symbols, is 8. The error correction capability, t, where 2t=n−k, for the example RS(72,64), up to 4 symbol errors in each code word may be detectable.

It is understood that the present invention is readily adapted for handling other RS codes and code word and symbol lengths.

In one aspect, the user can choose how to represent the finite field and operations are defined for and all formulae involve operations of members of the field, i.e., symbols become elements in the field. In the example provided herein, a unique field has 256 elements. For example, in GF256 example embodiment, a target code word or code element will have a length of 72 members (bytes), e.g., 65 bytes of data and 7 additional check symbols (e.g., 7 bytes) added to it. There will be 65 bytes of data, i.e., each element of GF 256 is a "byte" quantity, and include 7 additional check symbols added by the encoder. Each code word will thus have length 72, i.e., 1 symbol is an element of the GF 256, and the code word is a vector of 72 symbols (72 elements form GF256) and the RS-code is a collection of these code words, e.g., RS (72,65). The code is limited only in the sense of how many distinct 65 bytes patterns there is (number of code words).

Each 65 byte quantity computes a specific 7 byte appendum (check symbols) for storage as a code word. When reading data back, the 65 bytes and 7 check symbols (bytes) are sent to a syndrome generator which determines if the stored data has errors between the time it was read to memory and written back. If no errors, the syndromes generated are all zero; Otherwise, if errors are found, the resulting syndromes will be generated as other 7 byte quantities that inform about the nature of the errors. The information in the syndromes in one embodiment, allows finding the errors for correction.

To fully specify the code, there is assigned a unique memory address to each of the symbol locations. That is, a unique, non-zero, element of the field (in the example described GF($2^8$) field), is assigned to each location. As will be referred to herein, $\alpha_i$, refers to an address location for storing a data symbol, i.e., the address in memory of the $i^{th}$ data symbol is designated as $\alpha_i$. A restriction is imposed such that if $\alpha$ is an address, then so is $\phi\alpha$ (and therefore also $\phi^2\alpha$), where $\phi$ is an element of the field which satisfies equation 1) as follows:

$$\phi^2 + \phi + 1 = 0 \qquad 1)$$

The restriction assumes that the dimension of the field (GF$2^v$) is even (and therefore $\phi$ is an element of the field), and that the number of symbol locations is a multiple of three (3). If the dimension of the field is not even, one or two symbols may be added having a value of "0", for example, such that a new enlarged code is unique and is a length of multiple of three (3). Thus, symbol addresses (i.e., locations) in memory are governed according to:

$$\alpha_i = \alpha'_m \phi^n$$

where $\alpha_i$ is global address; $\alpha'_m$ refers to an address location within a block of addresses associated with a corresponding code word of an example embodiment ($\alpha'_m$ is a relative address within one of the address blocks n); "i" is the index over the entire codeword, e.g., location of the $i^{th}$ symbol (i= 0, . . . , 71 corresponding to 72 data symbols in an example embodiment described), n=0, 1, 2 for indicating one of three (3) blocks in the example implementation; $\phi^n$ indicates which block as determined by the power of value n, and m=0, . . . , 23 representing a block of 24 symbols (within a block) for an implementation of a code of 72 symbols described.

Thus, it is ensured that symbol addresses are assigned so that there are three (3) blocks of addresses which differ by a cube root of unity thereby allowing the data symbols to be combined. As will be described herein below, this ability for combining of data results in shrinkage of the odd syndrome generator circuits, as will be explained in greater detail below.

If the data in location i, which is read from memory, is $d_i$, then the syndromes are represented as $S_j = \Sigma_i (\alpha_i)^j d_i$ where, in the examples described herein, there are seven (7) or eight (8) syndromes (dependent upon the RS(n,k) implemented) where j=0, 1, 2, 3, 4, 5, 6 or 7 is an index ranging over the number of syndromes or check symbols for RS(72, 65) and RS(72, 64) respectively.

Since the finite fields implemented are vector spaces over Z/2, every element $d_i$ can be expressed as:
$d_i = \Sigma_k t_k * d_i(k)$ where $t_k$ form a basis for the vector space and $d_i(k)$ represent individual bits in Z/2. In an example implementation described herein, eight (8) bit symbols are used with each bit location k=0, . . . , 7 ranging over the bits of a symbol (eight bits/symbol in an example implementation). Thus the syndromes are calculated according to:

$$S_j = \Sigma_i (\alpha_i)^j d_i = \Sigma_k \Sigma_i t_k (\alpha_i)^j d_i(k).$$

Now defining: $SP_j(k) = \Sigma_i t_k (\alpha_i)^j d_i(k)$ there is obtained:

$$S_j = \Sigma_k SP_j(k).$$

Thus, if, in a memory cycle, only a part of the $d_i$ data elements are read, then the summation is performed only over the k's (i.e., bits) which are read.

A basic relation between the $SP_j(k)$'s, whose applications contributes much to reducing the size of the syndrome-generator (and as will be described below to that of the encoder as well) is:

$$SP_{2j}(k) = (t_k^{-1}) * (SP_j(k))^2.$$

This yields immediately that $SP_{4j}(k) = (t_k^{-1}) * (SP_{2j}(k))^2 = (t_k^{-3}) * (SP_j(k))^4$, and, more generally, if j is odd and $r = 2^s$ then the following syndrome computation results:

$$SP_{rj}(k) = (t_k^{-(r-1)}) * (SP_j(k))^r$$

where an index "r" runs from 0, . . . , 6 in the example embodiment.

Thus, in the circuit which computes the syndromes, there is a component which computes the $SP_j(k)$'s for only the odd values of j.

The second relation which reduces the size of the decoder circuit is the way the $SP_j(k)$'s are computed (for odd values of j). Recalling the memory addressing relation that $\alpha_i = \alpha'_m \phi^n$, where m=0, 1 . . . , 23, then:

$$SP_j(k) = \sum_i t_k(\alpha_i)^j d_i(k) = \sum_m \sum_n t_k(\alpha'_m)^j \varphi^{nj} d_{m,n}(k)$$

$$= \sum_m t_k(\alpha'_m)^j \sum_n \varphi^{nj} d_{m,n}(k)$$

$$= \sum_m t_k(\alpha'_m)^j d_{m,0}(k) + \sum_m t_k(\alpha'_m)^j \varphi^j d_{m,1}(k) + \sum_m t_k(\alpha'_m)^j \varphi^{2j} d_{m,2}(k)$$

Thus, if j=3s $$SP_j(k) = \sum_m t_k(\alpha'_m)^j d_{m,0}(k) + \sum_m t_k(\alpha'_m)^j d_{m,1}(k) + \sum_m t_k(\alpha'_m)^j d_{m,2}(k)$$

$$= \sum_m (t_k(\alpha'_m)^j)(d_{m,0}(k) + d_{m,1}(k) + d_{m,2}(k).$$

If j=3s+1, then $$SP_j(k) = \sum_m t_k(\alpha'_m)^j d_{m,0}(k) + \sum_m t_k(\alpha'_m)^j \varphi d_{m,1}(k) + \sum_m t_k(\alpha'_m)^j \varphi^2 d_{m,2}(k)$$

$$= \sum_m (t_k(\alpha'_m)^j)(d_{m,0}(k) + d_{m,2}(k)) +$$

$$\sum_m (t_k(\varphi\alpha'_m)^j)(d_{m,1}(k) + d_{m,2}(k))$$

If j=3s+2, then $$SP_j(k) = \sum_m t_k(\alpha'_m)^j d_{m,0}(k) + \sum_m t_k(\alpha'_m)^j \varphi^2 d_{m,1}(k) + \sum_m t_k(\alpha'_m)^j \varphi d_{m,2}(k)$$

$$= \sum_m (t_k(\alpha'_m)^j)(d_{m,0}(k) + d_{m,2}(k)) +$$

$$\sum_m (t_k(\varphi^2\alpha'_m)^j)(d_{m,1}(k) + d_{m,2}(k))$$

where $d_{m,0}$ to $d_{m,2}$ are the data inputs provided in three blocks per the addressing scheme employed (i.e., for a codeword length of 72, each $d_m$ being a block of 24 symbols of the word), e.g., a first index m ranges from 0 to 23 as indicated by the second index block "0", and, ranges from 24 to 48 as indicated by the second index block "1", and 49 to 72 as indicated by the second index block "2", for the embodiment of GF($2^8$) R-S code symbols.

Figure 6:
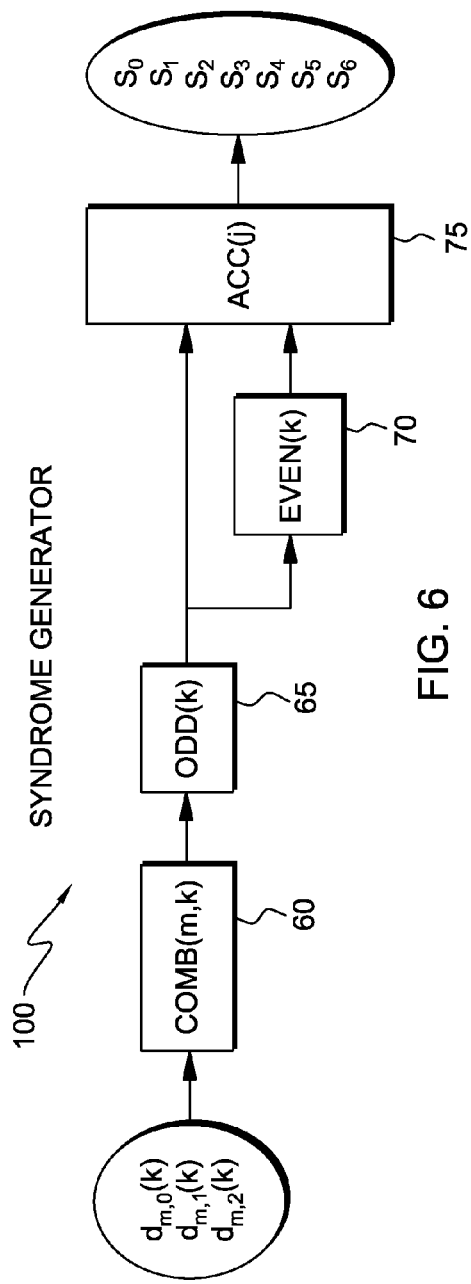
FIG. 6 illustrates the syndrome-generator circuit 100 that enables a reduced circuit implementation according to one embodiment of the invention.

In one embodiment, the syndrome-generator circuit 100, such as shown in FIG. 6, comprises several circuit components: a circuit referred to as COMB(m,k) 60, an ODD(k) circuit 65 connected to outputs of COMB(m,k) circuit 60; a circuit referred to as EVEN(k) circuit 70 connected to an output of ODD(k) circuit 65; and, a circuit referred to as ACC(j) circuit 75 connected to outputs of both the EVEN(k) and ODD(k). Details of the COMB(m,k) 60 is shown in FIG. 2; details of the ODD(k) circuit 65 is shown in FIG. 3; details of the EVEN(k) circuit 70 is shown in FIG. 4; and, details of the ACC(j) circuit 75 is shown in FIG. 5.

Figure 2:
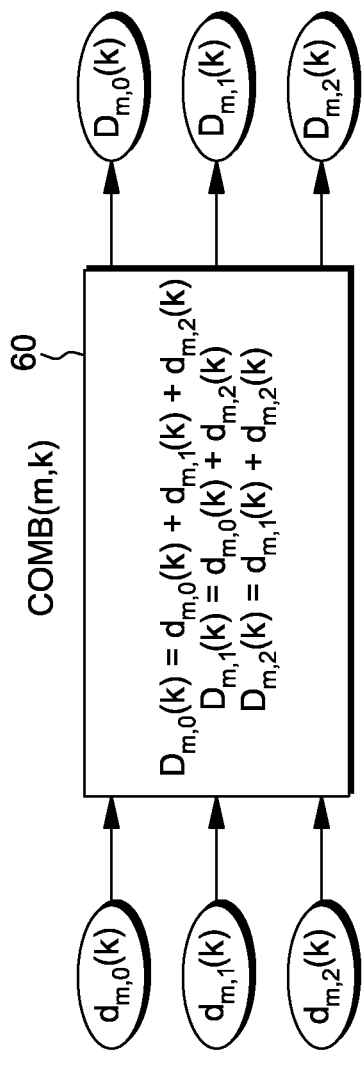
FIG. 2 depicts a COMB(m,k) combination generator circuit 60 that receives data inputs and provides the register and arithmetic logic for computing three output summations used in syndrome and check symbol generation according to an example embodiment.

The COMB(m,k) circuit 60 shown in FIG. 2 receives three data inputs: $d_{m,0}(k)$, $d_{m,1}(k)$, $d_{m,2}(k)$ and provides the register and arithmetic logic for computing the three outputs: $D_{m,0}(k)=d_{m,0}(k)+d_{m,1}(k)+d_{m,2}(k)$, $D_{m,1}(k)=d_{m,0}(k)+d_{m,2}(k)$, and $D_{m,2}(k)=d_{m,1}(k)+d_{m,2}(k)$.

Figure 3:
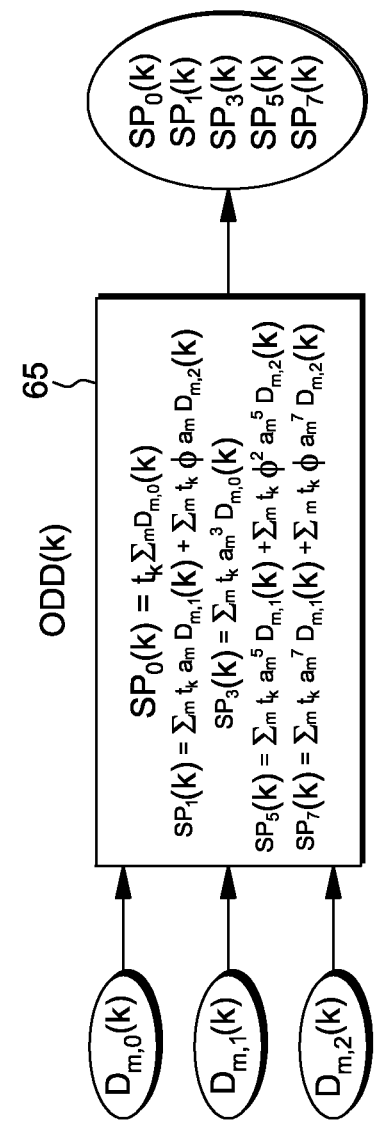
FIG. 3 depicts an ODD(k) circuit 65 that receives the $D_{m,0}(k)$'s, $D_{m,1}(k)$'s, and the $D_{m,2}(k)$'s as inputs from COMB (m,k) circuit 60, and computes three partial odd syndrome outputs according to an example embodiment.

The ODD(k) circuit 65, shown in FIG. 3 receives the $D_{m,0}(k)$'s, $D_{m,1}(k)$'s, and the $D_{m,2}(k)$'s as inputs from COMB(m,k) circuit 60, and it computes the three partial syndrome outputs:

$$SP_0(k)=t_k\Sigma_m(\alpha'_m)^j D_{m,0}(k);$$

$$SP_j(k)=\Sigma_m(t_k(\alpha'_m)^j)D_{m,0}(k) \text{ for all odd, non-zero } j\text{'s which are multiples of 3};$$

$$SP_j(k)=\Sigma_m(t_k(\alpha'_m)^j)D_{m,1}(k)+\Sigma_m(t_k(\phi\alpha'_m)^j)D_{m,2}(k) \text{ for all odd } j=3s+1;$$

$$SPj(k)=\Sigma_m(t_k(\alpha'_m)^j)D_{m,1}(k)+\Sigma_m(t_k(\phi^2\alpha'_m)^j)D_{m,2}(k) \text{ for all odd } j=3s+2.$$

The EVEN(k) circuit 70 shown in FIG. 4 receives as inputs from ODD(k) circuit 65 the partial syndrome outputs $SP_j(k)$'s, j odd, and it computes and outputs:

$$SP_{rj}(k)=(t_k^{-(r-1)})*(SP_j(k))^r, j \text{ odd}, r=2^s.$$

The circuit ACC(j) 75, shown in FIG. 5 receives as its inputs the partial syndromes, $SP_j(k)$, and it computes the syndromes $S_j=\Sigma_k SP_j(k)$. It should be understood that when the whole data is not read in one memory cycle then ACC accumulates the partial syndromes over additional memory cycles. More particularly, the seven (7) syndromes (in the example embodiment) are calculated to take each data symbol, multiply it each with an element of finite field and using a summation to produce each syndrome. Symbols are 8 bit quantities, and instead of working with all 8 bits of the symbol together, the calculations are performed 1 bit at a time, i.e., part of syndrome corresponding to first bit in each of data bits is first computed, then part of syndrome corresponding to $2^{nd}$ bit in each data byte, ... etc. for all 8 bits. Then, the eight (8) partial syndromes computed in 8 pieces are combined, e.g., by addition, resulting in syndromes $S_0$ to $S_7$.

FIG. 6 illustrates the syndrome generator circuit 100 of an exemplary embodiment. It is assumed that, in a memory cycle, K bits of a symbol are read (input), i.e., bits k=0, 1, 2, ..., K−1, where k is number of bits/symbol, e.g., eight (8) in an example embodiment. The syndrome-generator circuit 100 operates as follows:

1) First, the data read from memory is input to an array of COMB(m,k) circuits 60, one COMB(m,k) circuit for each value of m and k. These COMB(m,k) circuits compute the respective $D_{m,i}(k)$'s, thereby allowing the data symbols to be combined resulting in a reduction of the size of the odd syndrome circuits 65.

2) The $D_{m,i}(k)$'s are input to an array of ODD(k) circuits 65, one ODD(k) circuit for each value of k, which compute the $SP_j(k)$'s for all odd j as well as $SP_0(k)$;

3) The $SP_j(k)$'s (j odd), are input to an array of EVEN(k) circuits 70, one EVEN(k) circuit for each value k, which compute the $SP_j(k)$'s for all non-zero even j's;

4) The $SP_j(k)$'s are input to the ACC(j) 75 circuit which computes the syndromes $S_j$ (in one or more memory cycles).

In one aspect, based on the decoding algorithm implemented and the memory speed versus the processor speed that runs the decoder algorithm, it is conceivable that the processing herein described may be performed in a single clock cycle, e.g., for a completely parallel encoder implementation where data is operated on and processed as fast as data arrives; however, if the memory speed, for example, is slower than the processor speed, syndromes (and check symbols) in the parallel method described herein, may be computed in 2 or more clock cycles.

Encoder

In a further aspect, the encoder design enables the computation of the check symbols, e.g., seven or eight in the example embodiments described, that when added to end of data, the result when fed in the syndrome generator would be zero. Thus, check symbol computations for the encoder design is efficiently performed by the particular addressing scheme described herein, and solving of a matrix equations involved in syndrome generator computations, wherein the computed syndromes $S_j$ output of the syndrome generator is multiplied by a matrix (an inverse of the matrix used in the syndrome generator) to calculate the check symbols.

Figure 10A:
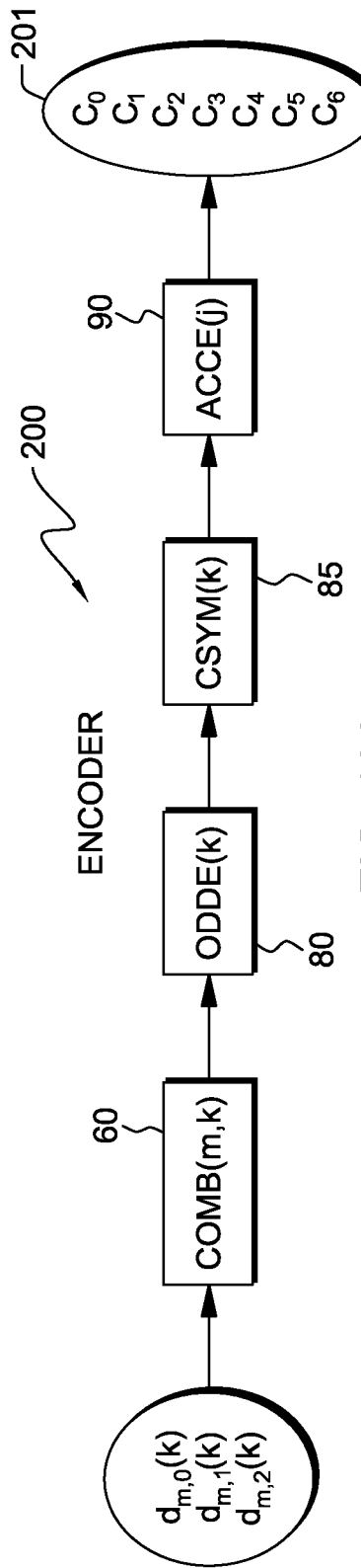
FIG. 10A illustrates the encoder circuit 200 that enables a reduced circuit implementation according to one embodiment of the invention.
Figure 10B:
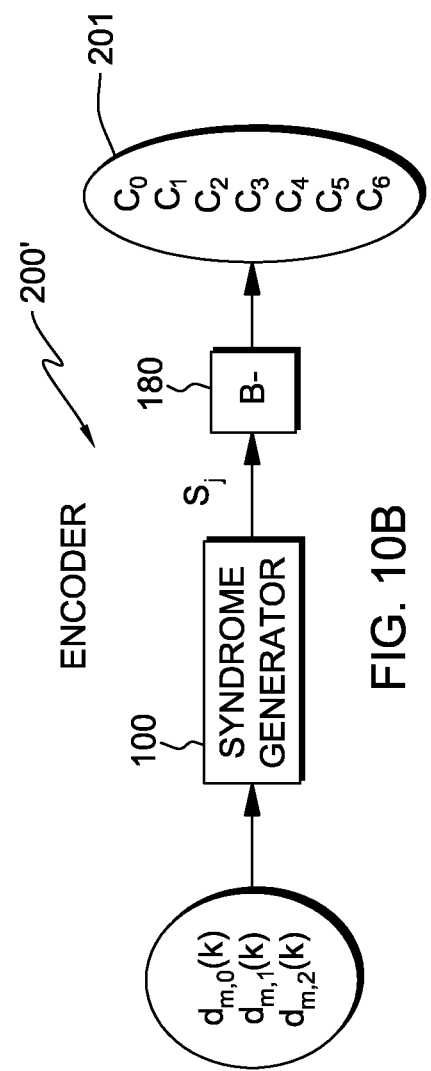
FIG. 10B illustrates an encoder circuit 200' utilizing the inverse matrix used in syndrome generator circuit 100 to calculate the check symbols.

That is, in the embodiment shown in FIG. 10B, encoder device 200' employs the syndrome generator 100 to work on the data having a check positions initialized to zero, and to calculate check symbols using the inverse of the matrix utilized in syndrome generation. Applying syndrome generator as part of encoder design and multiplying by inverse matrix to obtain the check symbols, i.e., check symbols are computed using modified version of syndrome generator which applies an inverse matrix. The actual matrix B is computed in syndrome generation to include entries comprising powers of addresses (of check symbol locations $(\alpha_r)^j$ r and j running over range of 0, ..., 6, 7 in the example implementations) and an inverse of this matrix B is precomputed as the code is designed. In the system, the encoder receives the data, e.g., $d_{m,0}$, $d_m$, $d_{m,2}$ having check positions equal to zero (e.g., 72 symbols in example embodiment) and these data are input to syndrome generator 180 to obtain the syndromes, e.g., 7 syndromes. These syndromes are multiplied by the inverse matrix $B^{-1}$ computed with check positions equal to zero to obtain the check symbol values.

Thus, the encoder 200' as shown in FIG. 10B, advantageously utilizes the syndrome generator circuitry, and the encoder processing is afforded the same benefits described herein with respect to syndrome generation, e.g., bitwise computation, including reduction of circuit size given the use of smaller matrix computations (e.g., 7×7 matrix) inside the encoder.

For an encoder circuit having a reduced circuit implementation, the seven (or eight) check symbols, in the described embodiment, are first assigned addresses in memory. For the example embodiment described, the system assigns symbol addresses so that, for an example GF($2^8$) which has 72 symbols, there are three (3) blocks of addresses, each of 24 symbols, which differ by a cube root of unity to allow the data symbols to be combined for reducing size and complexity of odd syndrome circuits. In the embodiment of the encoder described herein below with respect to FIG. 10A, the check symbols $c_r$ are assigned to addresses $\alpha_r$, for r=0, 1, 2, 3, 4, 5, 6 or 7 (It is understood that the same designation of the addresses is used as in the above description of the syndrome).

More particularly, the data symbols $d_i$, e.g., 64 or 65 in the example embodiments, are stored in the remaining addresses $a_i$. It should be understood that the described embodiment does not depend on the specific addresses which are assigned to the check symbols, and that the assignment described herein above is just for purposes of an example. In one example, use $d_i=0$ if $a_i$ is an address of a check symbol. Receiving the data, one function of the encoder is to choose the check symbols $c_r$ that satisfy the equations:

$$\Sigma_r(\alpha_r)^j c_r = \Sigma_i(\alpha_i)^j d_i, \text{ for all } j.$$

Denoting by "c" the vector whose components are the $c_r$'s, then the equations above are written as:

Bc=Ap*d, where B=$(\alpha_r^j)$, r ranging over all locations of check symbols; and Ap=$(\alpha_i^j)$, i ranging over all locations. This follows from the assumption that $d_i=0$ if "i" is a location of a check symbol.

The encoder starts by treating one bit of the input, i.e., it computes c(k) where, in matrix notation:

Bc(k)=$t_k$Ap*d(k) and then sums up the c(k)'s to obtain c.

The construction of the encoder is now described by way of example and can be extended to a general case. As was done for the syndrome generator description, supra, this example considers only the case that j is an odd number or 0. In one embodiment, the equation which the check symbols satisfy are given as:

$$B * \underline{c(k)} = \begin{pmatrix} t_k & 0 & 0 & 0 \\ 0 & 0 & t_k & 0 \\ 0 & 0 & t_k S & 0 \\ 0 & t_k & 0 & 0 \\ 0 & 0 & t_k S^2 & 0 \\ 0 & 0 & 0 & t_k \\ 0 & t_k S & 0 & 0 \end{pmatrix} * \begin{bmatrix} \sum_m D_{m,0}(k) \\ \sum_m a_m^3 D_{m,0}(k) \\ \sum_m a_m D_{m,1}(k) + \sum_m \varphi a_m D_{m,2}(k) \\ \sum_m a_m^5 D_{m,1}(k) + \sum_m \varphi^2 a_m^5 D_{m,2}(k) \end{bmatrix} = M(k)V(k)$$

where:

$$D_{m,0}(k)=d_{m,0}(k)+d_{m,1}(k)+d_{m,2}(k),$$

$$D_{m,1}(k)=d_{m,0}(k)+d_{m,2}(k),$$

$$D_{m,2}(k)=d_{m,1}(k)+d_{m,2}(k);$$

and S is, for example, an 8×8 matrix (over GF(2)) such that for every element "e" of GF(256) Se=$e^2$.

Using $AQ_0$ to denote a matrix whose $m^{th}$ column is $\alpha_m^3$, $AQ_1$ to denote the matrix whose $m^{th}$ column $[\alpha_m \ \alpha_m^5]$ and $AQ_2$ to denote the matrix whose $m^{th}$ column is $[\phi^{\alpha_m} \ \phi^2 \alpha_m^5]$. There is additionally $D_j(k)$ denoting the vector whose $m^{th}$ element is $D_{m,j}(k)$. Using this notation it follows that:

$$B * \underline{c(k)} = ( M(k)_0 \quad M(k)_1 \quad M(k)_2 ) * \begin{pmatrix} \sum_m D_{m,0}(k) \\ AQ_0 * \underline{D_0(k)} \\ AQ_1 * \underline{D_1(k)} + AQ_2 * \underline{D_2(k)} \end{pmatrix}$$

where $$M(k)_0 = \begin{pmatrix} t_k \\ 0 \\ 0 \\ 0 \\ 0 \\ 0 \\ 0 \end{pmatrix}, M(k)_1 = \begin{pmatrix} 0 \\ 0 \\ 0 \\ t_k \\ 0 \\ 0 \\ t_k S \end{pmatrix}, \text{ and } M(k)_2 = \begin{pmatrix} 0 & 0 \\ t_k & 0 \\ t_k S & 0 \\ 0 & 0 \\ t_k S^2 & 0 \\ 0 & t_k \\ 0 & 0 \end{pmatrix}$$

Thus, it follows that:

$$\underline{c(k)} = ( B^{-1}M(k)_0 \quad B^{-1}M(k)_1 \quad B^{-1}M(k)_2 ) * \begin{pmatrix} \sum_m D_{m,0}(k) \\ AQ_0 * \underline{D_0(k)} \\ AQ_1 * \underline{D_1(k)} + AQ_2 * \underline{D_2(k)} \end{pmatrix}$$

The rank of the matrix $B^{-1}M(k)_1$, viewed as a 56×8 matrix over GF(2), is 8. Thus, it has an 8×8 nonsingular sub-matrix $R(k)_1$; and $$B^{-1}M(k)_1 = (B^{-1}M(k)_1 R(k)_1^{-1})R(k)_1 = N(k)_1 R(k)_1.$$

The rank of the matrix $B^{-1}M(k)_2$, viewed as a 56×16 matrix over GF(2), is 16. Thus, it has a 16×16 nonsingular sub-matrix $R(k)_2$; and, $$B^{-1}M(k)_2 = (B^{-1}M(k)_2 R(k)_2^{-1})R(k)_2 = N(k)_2 R(k)_2.$$

There is additionally defined $N(k)_0 = B^{-1}M(k)_0$. It thus follows that:

$$\underline{CP(k)} = ( N(k)_0 \quad N(k)_1 \quad N(k)_2 ) *$$

$$\begin{pmatrix} \sum_m D_{m,0}(k) \\ (R(k)_1 * AQ_0) * \underline{D_0(k)} \\ (R(k)_2 * AQ_1) * \underline{D_1(k)} + (R(k)_2 * AQ_2) * \underline{D_2(k)} \end{pmatrix}$$

Figure 7:
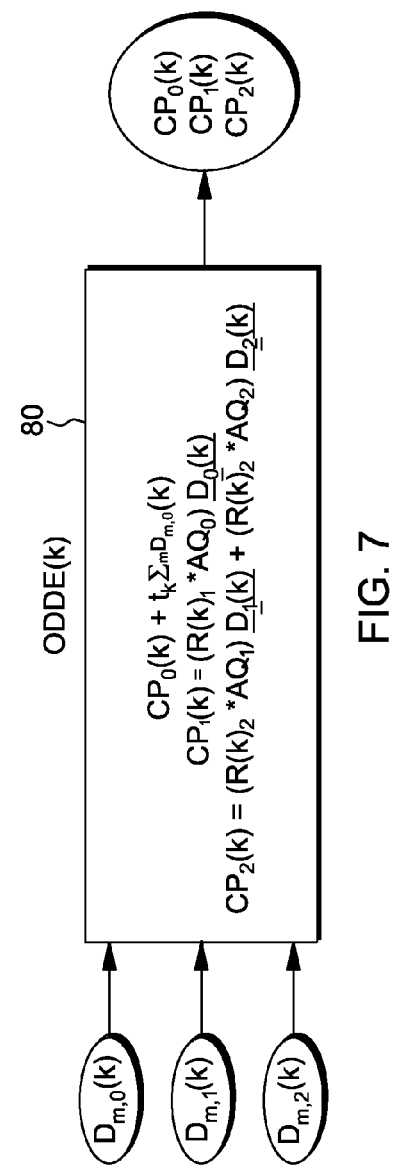
FIG. 7 depicts an ODDE(k) circuit 80 that receives as its inputs the $D_{m,0}(k)$'s, $D_{m,1}(k)$'s, and the $D_{m,2}(k)$'s as inputs from COMB(m,k) circuit 60, and computes partial odd check symbol outputs according to an example embodiment.
Figure 8:
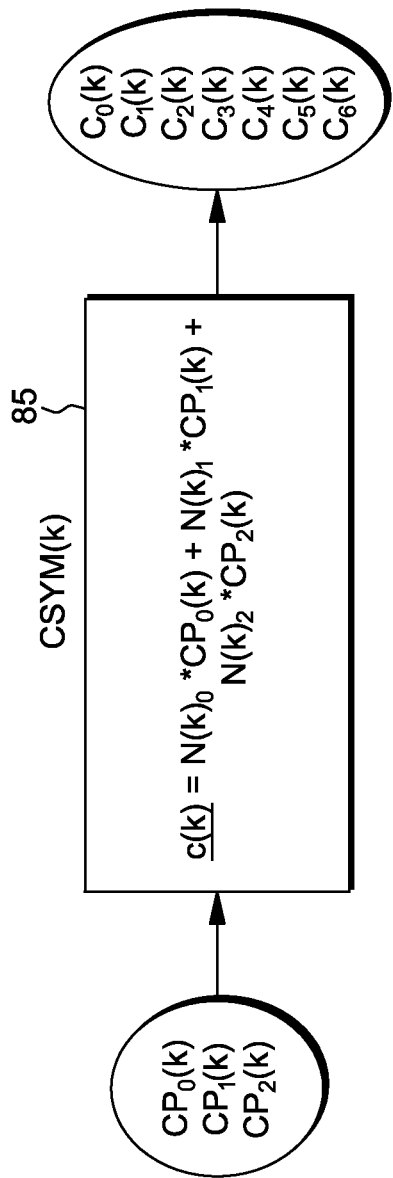
FIG. 8 depicts an Csym(k) circuit 85 that receives the partial odd check symbol outputs from ODDE(k) circuit 80 and generates partial check symbols according to an example embodiment.
Figure 9:
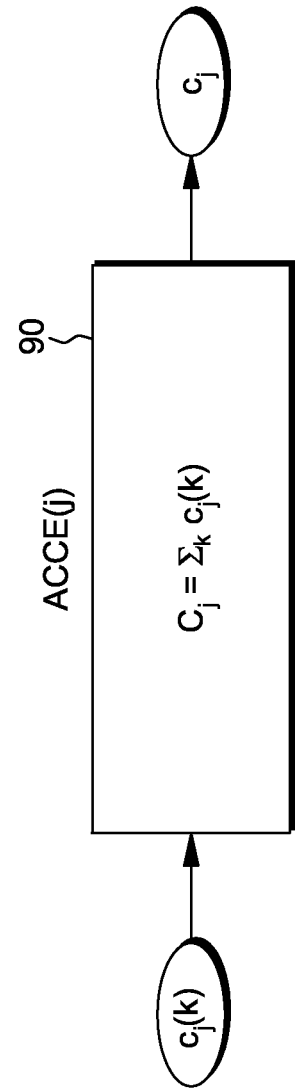
FIG. 9 depicts an ACCE(j) circuit 90 that receives the partial check symbols computes the check symbols according to an example embodiment.

In one embodiment, the encoder circuit 200 (such as shown in FIG. 10) comprises several circuit components including: the circuit referred to as COMB(m,k) 60, shown in further detail in FIG. 2; a circuit referred to as ODDE(k) 80, shown in further detail in FIG. 7; a circuit referred to as Csym(k) 85, shown in further detail in FIG. 8; and, a circuit referred to as ACCE(j) 90 shown in further detail in FIG. 9.

In one embodiment, the circuit COMB(m,k) 60, shown in FIG. 2, has three inputs, $d_{m,0}(k)$, $d_{m,1}(k)$, $d_{m,2}(k)$, and it computes the three outputs:

$$D_{m,0}(k)=d_{m,0}(k)+d_{m,1}(k)+d_{m,2}(k),$$

$$D_{m,1}(k)=d_{m,0}(k)+d_{m,2}(k), \text{ and}$$

$$D_{m,2}(k)=d_{m,1}(k)+d_{m,2}(k).$$

The circuit ODDE(k) 80, shown in FIG. 7 receives as its inputs the $D_{m,0}(k)$'s, $D_{m,1}(k)$'s, and the $D_{m,2}(k)$'s, and it computes the following:

$$CP_0(k)=t_k\Sigma_m D_{m,0}(k)$$

$$CP_1(k)=(R(k)_1 * AQ_0)*D_0(k)$$

$$CP_2(k)=(R(k)_2 * AQ_1)*D_1(k)+(R(k)_2 * AQ_2)*D_2(k)$$

The circuit CSYM(k) 85, shown in FIG. 8, receives as inputs the CPj(k)'s, j=0, 1, 2, and it computes:

$$c(k)=N(k)_0*CP_0(k)+N(k)_1*CP_1(k)+N(k)_2*CP_2(k).$$

The circuit ACCE(j) 90, shown in FIG. 9 receives as inputs the partial check symbols, Cp$_j$(k), and it computes the check symbols c$_j$=Σ$_k$c$_j$(k). As mentioned above, it is understood that when the whole data is not read in one memory cycle, then ACCE(j) 90 may accumulate the partial syndromes over several memory cycles.

The encoder device 200 in an exemplary embodiment is shown in FIG. 10A. It is assumed that at a memory cycle K bits of a symbol are read, i.e., k=0, 1, 2, . . . , K−1. The encoder circuit 200 works as follows:

1) First, the data read goes to an array of COMB(m,k) circuits 60, one for each value of m and k. These circuits compute the D$_{m,i}$(k)'s. It has been further assumed that d$_{m,i}$=0 for all positions of the check symbols;
2) The Dm,i(k)'s are input into an array of ODDE(k) circuits 80, one for each value of k, which compute the CP$_j$(k)'s for j=0, 1, 2;
3) The Cp$_j$(k)'s are input into an array of CSYM(k) circuits 85, one for each value k, which compute CP(k); and,
4) The CP(k)'s are input into the ACCE(j) circuit 90 which computes the check symbols C 201.

Thus, in one aspect of the invention, the memory is configured according to a unique and efficient address scheme. In one embodiment, a non-standard address assignment is used to save space in circuit for encoding and computing syndromes. In the described embodiment, each address is in three blocks, i.e., there are 72/3 or 24 symbols, in each block.

Further, according to one embodiment of the invention, there is computed the contributions to the syndromes and check symbols 1 bit at a time instead of 1 symbol at a time. As a result, the even syndromes can be computed as powers of the odd syndromes and computed much more efficiently according to the above-described relation: $SP_{2j}(k)=(t_k^{-1})*(SP_j(k))^2$. The assigning of symbol addresses so that there are, for an example GF($2^8$) which has 72 symbols, three (3) blocks of addresses which differ by a cube root of unity allows the data symbols to be combined enables reduced size and complexity of odd syndrome circuits. In a further aspect, the way the SPj(k)'s are computed (for odd values of j) when the memory addressing relation is $\alpha_i=\alpha_m\phi^n$, where m=0, 1 . . . , 7, in the example implementation, enables reduction in the size of the decoder circuit. Further, the implementation encoder circuit for generating check symbols is derived from syndrome circuit using the inverse of the part of the syndrome matrix for check locations. These implementations yield a syndrome generator/encoder circuit which is less than half the size of a conventional parallel circuit implementation that performs the same task.

In sum, the present embodiment enables 1) computing of the syndromes based on 1 bit from the input symbols so that the even syndromes can be computed as powers of odd syndromes. Further, 2) there is used a particular addressing scheme involving phi (φ) which satisfies the equation φ2+φ+1=0. The computing according to 1) can be applied to Reed Solomon codes defined over GF($2^k$) for any k; and computing according to 2) can be applied to Reed Solomon codes defined over GF($2^k$) for k even. It is common that k=8 for most situations and is thus even so both 1) and 2) can be used.

Figure 11:
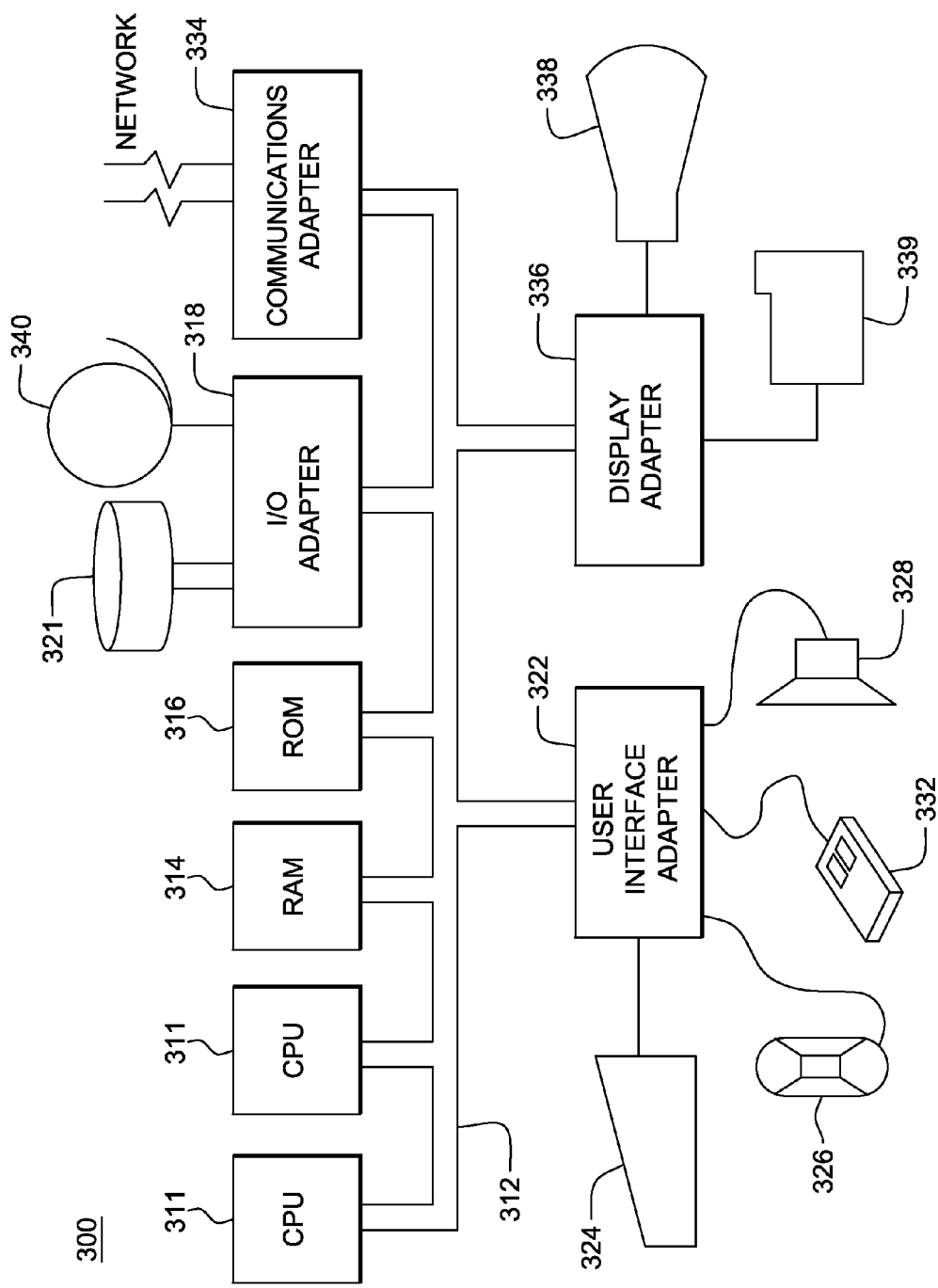
FIG. 11 illustrates an exemplary hardware configuration of a computing system 300 in which the Reed-Solomon encoder/decoder device of FIGS. 6 and 10 may be implemented

FIG. 11 illustrates an exemplary hardware configuration of a computing system 300 in which the Reed-Solomon encoder/decoder device of FIGS. 6 and 10A,B may be implemented for encoding/decoding data. The hardware configuration preferably has at least one processor or central processing unit (CPU) 311. The CPUs 311 are interconnected via a system bus 312 to a random access memory (RAM) 314, read-only memory (ROM) 316, input/output (I/O) adapter 318 (for connecting peripheral devices such as disk units 321 and tape drives 340 to the bus 312), user interface adapter 322 (for connecting a keyboard 324, mouse 326, speaker 328, microphone 332, and/or other user interface device to the bus 312), a communication adapter 334 for connecting the system 300 to a data processing network, the Internet, an Intranet, a local area network (LAN), etc., and a display adapter 336 for connecting the bus 312 to a display device 338, and/or printer 339 (e.g., a digital printer of the like).

Although the embodiments of the present invention have been described in detail, it should be understood that various changes and substitutions can be made therein without departing from spirit and scope of the inventions as defined by the appended claims. Variations described for the present invention can be realized in any combination desirable for each particular application. Thus particular limitations, and/or embodiment enhancements described herein, which may have particular advantages to a particular application need not be used for all applications. Also, not all limitations need be implemented in methods, systems and/or apparatus including one or more concepts of the present invention.

The present invention can be realized in hardware, software, or a combination of hardware and software. A typical combination of hardware and software could be a general purpose computer system with a computer program that, when being loaded and run, controls the computer system such that it carries out the methods described herein. The present invention can also be embedded in a computer program product, which comprises all the features enabling the implementation of the methods described herein, and which—when loaded in a computer system—is able to carry out these methods.

Computer program means or computer program in the present context include any expression, in any language, code or notation, of a set of instructions intended to cause a system having an information processing capability to perform a particular function either directly or after conversion to another language, code or notation, and/or reproduction in a different material form.

Thus the invention includes an article of manufacture which comprises a computer usable medium having computer readable program code means embodied therein for causing a function described above. The computer readable program code means in the article of manufacture comprises computer readable program code means for causing a computer to effect the steps of a method of this invention. Similarly, the present invention may be implemented as a computer program product comprising a computer usable medium having computer readable program code means embodied therein for causing a function described above. The computer readable program code means in the computer program product comprising computer readable program code means for causing a computer to effect one or more functions of this invention. Furthermore, the present invention may be implemented as a program storage device readable by machine, tangibly embodying a program of instructions runnable by the machine to perform method steps for causing one or more functions of this invention.

The present invention may be implemented as a computer readable medium (e.g., a compact disc, a magnetic disk, a hard disk, an optical disk, solid state drive, digital versatile disc) embodying program computer instructions (e.g., C, C++, Java, Assembly languages, Net, Binary code) run by a processor (e.g., Intel® Core™, IBM® PowerPC®) for causing a computer to perform method steps of this invention. The present invention may include a method of deploying a computer program product including a program of instructions in a computer readable medium for one or more functions of this invention, wherein, when the program of instructions is run by a processor, the compute program product performs the one or more of functions of this invention.

It is noted that the foregoing has outlined some of the more pertinent objects and embodiments of the present invention. This invention may be used for many applications. Thus, although the description is made for particular arrangements and methods, the intent and concept of the invention is suitable and applicable to other arrangements and applications. It will be clear to those skilled in the art that modifications to the disclosed embodiments can be effected without departing from the spirit and scope of the invention. The described embodiments ought to be construed to be merely illustrative of some of the more prominent features and applications of the invention. Other beneficial results can be realized by applying the disclosed invention in a different manner or modifying the invention in ways known to those familiar with the art.

While the invention has been particularly shown and described with respect to illustrative and preferred embodiments thereof, it will be understood by those skilled in the art that the foregoing and other changes in form and details may be made therein without departing from the spirit and scope of the invention that should be limited only by the scope of the appended claims.

What is claimed is:

1. An error correction code (ECC) syndrome generator circuit comprising:
   first syndrome generator circuitry for receiving data symbols and generating partial odd syndromes, $SP_j(k)$'s, for odd values of j, for each bit location k of an output data symbol, wherein k=0, 1, 2, ... K−1 bits;
   second syndrome generator circuitry for receiving said partial odd syndromes, $SP_j(k)$'s, for odd values of j, and computing partial even syndromes, $SP_j(k)$'s for even values of j, for each bit location k; and,
   first accumulator circuitry for receiving the partial odd syndromes and the computed partial even syndromes, $SP_j(k)$, and computing the syndromes $S_j=\Sigma_k SP_j(k)$, j is number of syndromes to be generated and k is number of bits of a data symbol.

2. The ECC syndrome generator circuit as claimed in claim 1, wherein said first syndrome generator circuitry and said second syndrome generator circuitry compute contributions to respective partial odd and even syndromes one data bit at a time.

3. The ECC syndrome generator circuit as claimed in claim 2, wherein said first syndrome generator circuitry includes an array of odd generator circuits, one odd generator circuit for each value of k that receives a respective $D_{m,i}(k)$ for computing $SP_0(k)$ and said $SP_j(k)$'s for odd values of j.

4. The ECC syndrome generator circuit as claimed in claim 3, wherein said second syndrome generator circuitry includes an array of even generator circuits, one even generator circuit for each value k that receives a respective computed $SP_j(k)$, for odd values of j, for computing the $SP_j(k)$'s for all non-zero even values of j, wherein for j is odd and r=2s, said partial even syndromes is computed according to:

$$SP_{rj}(k) = (t_k^{-(r-1)}) * (SPj(k))^r \text{ where } t_k \text{ is a basis vector and "s" is an integer.}$$

5. The ECC syndrome generator circuit as claimed in claim 2, further comprising:
   first check symbol generator circuitry receiving said data symbols and generating respective partial check symbols;
   a second check symbol generator circuitry circuit receiving said respective partial check symbols and computing a check symbol vector comprising individual bit values of said check symbol; and,
   second accumulator circuitry for receiving the check symbol vector comprising individual bit values and accumulating the partial odd and partial even syndromes to result in a check symbol $cj=\Sigma_k cj(k)$ where j is number of check symbols to be generated and k is number of bits of a data symbol.

6. The ECC syndrome generator circuit as claimed in claim 1, further comprising:
   combination generator circuit for receiving the data symbols, each data symbol of predetermined bit length, and generating output data symbols, each output data symbol comprising a combination of one or more symbols located at predetermined addresses wherein said combination generator circuit includes an array of circuits, one array circuit for each combination of m and k that compute a respective output data symbol $D_{m,i}(k)$, where m and i are integers ≥0.

7. The ECC syndrome generator circuit as claimed in claim 1, wherein each data symbol is assigned one of three possible address locations according to:

$$\alpha_i = \alpha'_m \phi^n,$$

where address "α" and α' are symbol addresses, "φ" is a non-zero multiplier, and m, n and are positive integers such that $\alpha'_m$ is a relative address of a symbol within one of n address blocks, i is an integer representing the $i^{th}$ symbol; and, $\phi^n$ indicates which address block as determined by a value of n, and m is an index representing a symbol used within an address block.

8. The ECC syndrome generator circuit as claimed in claim 7, wherein φ is determined according to: $\phi^2 + \phi + 1 = 0$.

9. The ECC syndrome generator circuit as claimed in claim 1, implemented in a data encoder circuit for computing check symbols, wherein said syndromes generated for data symbols are generated using a first matrix, said encoder circuit comprising:
   means for multiplying said generated syndromes to an inverse of said first matrix for determining check symbol values corresponding to said data to be encoded.

10. A method for computing the syndromes of an Error Correcting Code (ECC) comprising:
    receiving data symbols at first syndrome generator circuitry and generating partial odd syndromes, said first syndrome generator circuitry computing the partial odd syndromes (SPj(k)'s for odd values of j, wherein k=0, 1, 2, ..., K−1 represents the number of bits in a symbol;
    receiving, at second syndrome generator circuitry, said partial odd syndromes SPj(k)'s, for odd values of j, and computing partial even syndromes from said partial odd syndromes a single bit at a time; and,
    receiving, at first accumulator circuitry, the partial odd syndromes and partial even syndromes, SPj(k), and compute the syndromes $Sj=\Sigma_k SPj(k)$, j is number of syndromes to be generated and k is number of bits of a data symbol.

11. The method as claimed in claim 10, wherein at each said first syndrome generator circuitry and said second syndrome generator circuitry, computing contributions to respective partial odd and even syndromes one data bit at a time.

12. The method as claimed in claim 11, wherein said computing said partial odd syndromes is performed at an odd generator circuitry of an array of odd generator circuits for each value of k that receives a respective $D_{m,i}(k)$ for computing $SP_0(k)$ and said $SP_j(k)$'s for odd values of j.

13. The method as claimed in claim 12, wherein said computing said partial even syndromes is performed at an even generator circuit of an array of even generator circuits, one even generator circuit for each value k for receiving a respective computed SPj(k), for odd values of j, for computing the $SP_j(k)$'s for all non-zero even values of j, wherein for j is odd and r=2s, said partial even syndromes is computed according to:

$$SP_{rj}(k)=(t_k^{-(r-1)})*(SP_j(k))^r \text{ where } t_k \text{ is a basis vector and ``}s\text{'' is an integer.}$$

14. The method as claimed in claim 11, implemented in a data encoder circuit, said method further comprising:
  receiving, at an associated odd generator circuit, said data symbols from a combination generator circuit and generating respective odd partial check symbols;
  receiving, at a check symbol generator circuit, said partial check symbols and computing a check symbol vector comprising individual bit values of said partial check symbol; and,
  receiving, at second accumulator circuitry, the check symbol vector comprising individual bit values; and
  accumulating the partial odd and partial even syndromes over several memory cycles to result in a check symbol $c_j=\Sigma_k c_j(k)$ where j is number of check symbols to be generated and k is number of bits of a data symbol.

15. The method as claimed in claim 10, wherein said data symbols are first received at combination generator circuit for generating output data symbols, each output data symbol comprising a combination of one or more symbols located at predetermined addresses, wherein said generating output data symbols is performed at a single array of an array of combination generator circuits, one array circuit for each combination of m and k for computing a respective output data symbol $D_{m,i}(k)$, where m and i are integers $\geq 0$.

16. The method as claimed in claim 10, further comprising assigned each data symbol one of three possible address locations according to:

$$\alpha_i=\alpha'_m\phi^n,$$

where address "$\alpha$" and $\alpha'$ are symbol addresses, "$\phi$" is a non-zero multiplier, where $\phi^3=1$, and m, n and i are positive integers such that $\alpha'_m$ is a relative address of a symbol within one of n address blocks, i is an integer representing the $i^{th}$ symbol; and, $\phi^n$ indicates which address block as determined by a value of n, and m is an index representing a symbol used within an address block.

17. The method as claimed in claim 16, wherein $\phi$ is determined according to:

$$\phi^2+\phi+1=0.$$

18. The method as claimed in claim 10, implemented in a data encoder circuit for computing check symbols, wherein said syndromes generated for data symbols are generated using a first matrix, said method comprising:
  multiplying said generated syndromes to an inverse of said first matrix for determining check symbol values corresponding to said data to be encoded.

19. A computer program device for computing syndromes of an Error Correcting Code (ECC), the computer program device comprising a storage medium readable by a processing circuit, said storage medium not a propagating signal, and said storage medium storing instructions run by the processing circuit for performing a method, the method comprising:
  receiving data symbols at first syndrome generator circuitry and generating partial odd syndromes, said first syndrome generator circuitry computing said partial odd syndromes (SPj(k)'s for odd values of j, wherein k=0, 1, 2, ... K−1 represents the number of bits in a symbol;
  receiving, at second syndrome generator circuitry, said partial odd syndromes SPj(k)'s, for odd values of j, and computing partial even syndromes from said partial odd syndromes a single bit at a time; and,
  receiving, at first accumulator circuitry, the partial odd syndromes and partial even syndromes, SPj(k), and compute the syndromes $Sj=\Sigma_k SPj(k)$, j is number of syndromes to be generated and k is number of bits of a data symbol.

20. The computer program as claimed in claim 19, wherein at each said first syndrome generator circuitry and said second syndrome generator circuitry, computing contributions to respective partial odd and even syndromes one data bit at a time.

21. The computer program as claimed in claim 20, wherein said computing said partial even syndromes is performed at an even generator circuit of an array of even generator circuits, one even generator circuit for each value k for receiving a respective computed $SP_j(k)$, for odd values of j, for computing the $SP_j(k)$'s for all non-zero even values of j, wherein for j is odd and r=2s, said partial even syndromes is computed according to:

$$SP_{rj}(k)=(t_k^{-(r-1)})*(SP_j(k))^r \text{ where } t_k \text{ is a basis vector and ``}s\text{'' is an integer.}$$

22. The computer program as claimed in claim 19, further comprising assigned each data symbol one of three possible address locations according to:

$$\alpha_i=\alpha'_m\phi^n,$$

where address "$\alpha$" and $\alpha'$ are symbol addresses, "$\phi$" is a non-zero multiplier, where $\phi^3=1$, and m, n and i are positive integers such that $\alpha'_m$ is a relative address of a symbol within one of n address blocks, i is an integer representing the $i^{th}$ symbol; and, $\phi^n$ indicates which address block as determined by a value of n, and m is an index representing a symbol used within an address block.

23. The computer program as claimed in claim 19, implemented in a data encoder circuit for computing check symbols, wherein said syndromes generated for data symbols are generated using a first matrix, said method comprising:
  multiplying said generated syndromes to an inverse of said first matrix for determining check symbol values corresponding to said data to be encoded.

* * * * *